United States Patent
Tsai et al.

(10) Patent No.: US 8,587,071 B2
(45) Date of Patent: Nov. 19, 2013

(54) ELECTROSTATIC DISCHARGE (ESD) GUARD RING PROTECTIVE STRUCTURE

(75) Inventors: Tsung-Che Tsai, Hsinchu (TW); Jam-Wem Lee, Zhubei (TW); Yi-Feng Chang, Xinbei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/452,991

(22) Filed: Apr. 23, 2012

(65) Prior Publication Data

US 2013/0277745 A1    Oct. 24, 2013

(51) Int. Cl.
*H01L 23/62* (2006.01)

(52) U.S. Cl.
USPC ........... 257/357; 257/168; 257/170; 257/173; 257/139; 257/140; 257/141; 257/142; 257/143; 257/144; 257/145; 257/E29.014; 257/372; 257/E29.012; 257/E29.013; 257/E27.063

(58) Field of Classification Search
USPC ......... 257/357, 372, 139, 140, 141, 142, 143, 257/144, 145, E27.063, 168, 170, 173, 257/E29.012, E29.013, E29.014
See application file for complete search history.

(56) References Cited

U.S. PATENT DOCUMENTS

| | | | | |
|---|---|---|---|---|
| 4,149,176 A | * | 4/1979 | Satou et al. | 257/373 |
| 7,129,779 B2 | * | 10/2006 | Inao et al. | 330/250 |
| 7,372,083 B2 | * | 5/2008 | Lee et al. | 257/173 |
| 7,956,418 B2 | * | 6/2011 | Chuang | 257/355 |
| 2005/0179093 A1 | * | 8/2005 | Morris | 257/371 |
| 2010/0289057 A1 | * | 11/2010 | Sheu et al. | 257/133 |
| 2011/0186909 A1 | | 8/2011 | Tsai et al. | |

* cited by examiner

*Primary Examiner* — Matthew W Such
*Assistant Examiner* — Samuel Lair
(74) *Attorney, Agent, or Firm* — Duane Morris LLP

(57) ABSTRACT

An ESD protection circuit includes a MOS transistor of a first type, a MOS transistor of a second type, an I/O pad, and first, second, and third guard rings of the first, second, and first types, respectively. The MOS transistor of the first type has a source coupled to a first node having a first voltage, and a drain coupled to a second node. The MOS transistor of the second type has a drain coupled to the second node, and a source coupled to a third node having a second voltage lower than the first voltage. The I/O pad is coupled to the second node. The first, second, and third guard rings are positioned around the MOS transistor of the second type.

11 Claims, 4 Drawing Sheets

ELECTROSTATIC DISCHARGE (ESD) GUARD RING PROTECTIVE STRUCTURE

BACKGROUND

With the continued miniaturization of integrated circuit (IC) devices, the present trend is to produce integrated circuits having shallower junction depths, thinner gate oxides, lightly-doped drain (LDD) structures, shallow trench isolation (STI) structures, and self-aligned silicide (salicide) processes, all of which are used in advanced sub-quarter-micron complementary metal oxide semiconductor (CMOS) technologies. All of these processes cause the related CMOS IC products to become more susceptible to damage due to electrostatic discharge (ESD) events. ESD is a serious problem confronting circuit designers, because electrostatic voltages can build up from a variety of environmental sources and can reach high voltage values. During discharge, high transient currents can damage equipment by generating high temperatures that can melt circuit components. Therefore, ESD protection circuits are built onto the chip to protect the devices and circuits on the IC from ESD damage.

An ESD protection circuit is typically added to integrated circuits (ICs) at bond pads. The pads are the connections to outside circuits, for electric power supplies, electric grounds, and electronic signals. An ESD protection circuit has two states: normal operation mode and ESD mode. When an IC is in the normal operation mode, the ESD protection circuit appears invisible to the IC by blocking current through itself. In the ESD mode, the ESD protection circuit provides an electrical path to a safe terminal, typically a power supply pin or ground pin, and causes the electrostatic current (called a "strike") to bypass the susceptible semiconductor devices formed within the IC.

ESD events typically happen between an input, input/output or output pad and another terminal, either VSS (ground) or VDD (positive power supply). Four modes of ESD stress are commonly described. A positive voltage from a pad to VSS is referred to as a PS strike, a positive voltage from a pad to VDD is referred to as a PD strike, a negative voltage from a pad to VSS is referred to as an NS strike, and a negative voltage from a pad to VDD is referred to as a ND strike.

BRIEF DESCRIPTION OF THE DRAWINGS

The following will be apparent from elements of the figures, which are provided for illustrative purposes and are not necessarily to scale.

DETAILED DESCRIPTION

Figure 1:
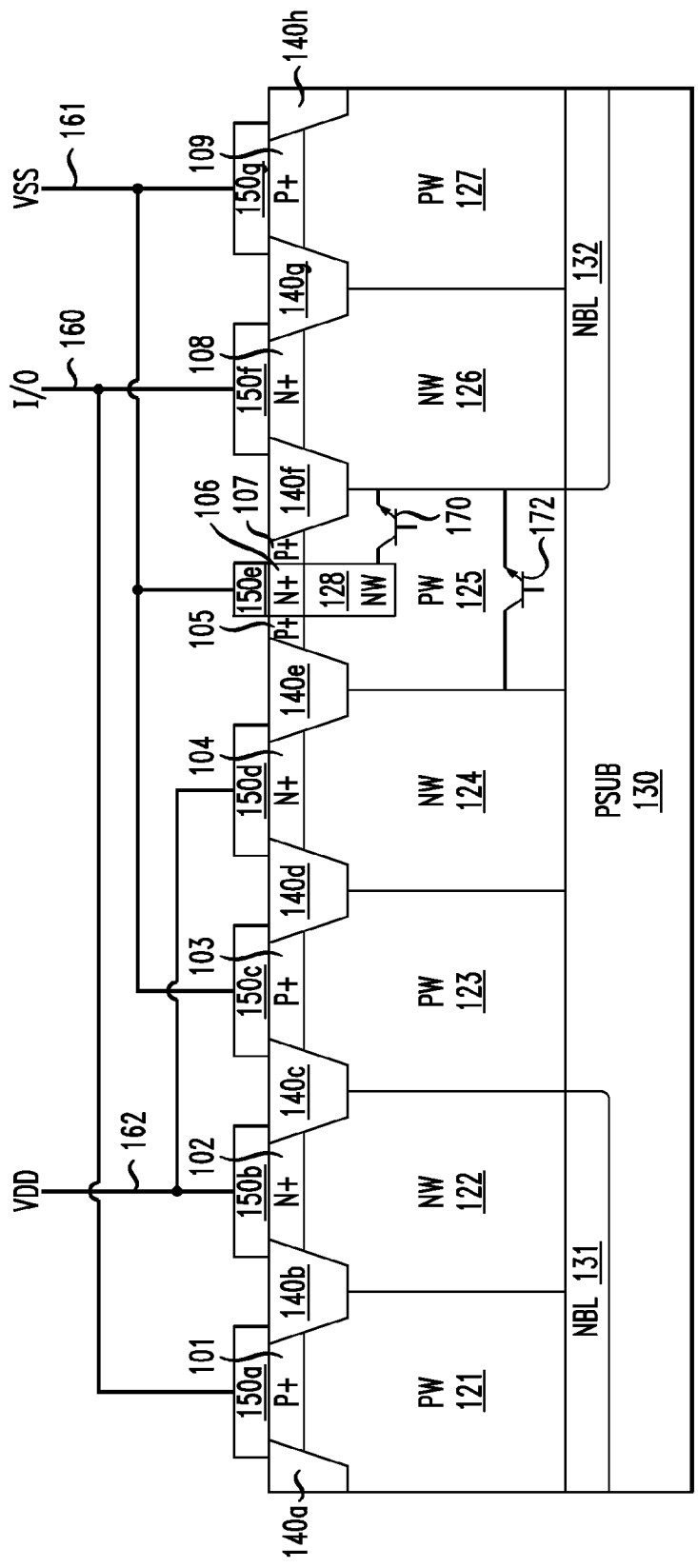
FIG. 1 is a cross-sectional view of an electrostatic discharge (ESD) protection circuit structure in accordance with some embodiments of the present disclosure.

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

In the description, relative terms such as "lower," "upper," "horizontal," "vertical,", "above," "below," "up," "down," "top" and "bottom" as well as derivative thereof (e.g., "horizontally," "vertically," "downwardly," "upwardly," etc.) should be construed to refer to the orientation as then described or as shown in the drawing under discussion. These relative terms are for convenience of description and do not require that the apparatus be constructed or operated in a particular orientation. The term "around," when used in the context of a first element being positioned around a second element, does not require that the first element be directly bordering the second element.

Figure 2:
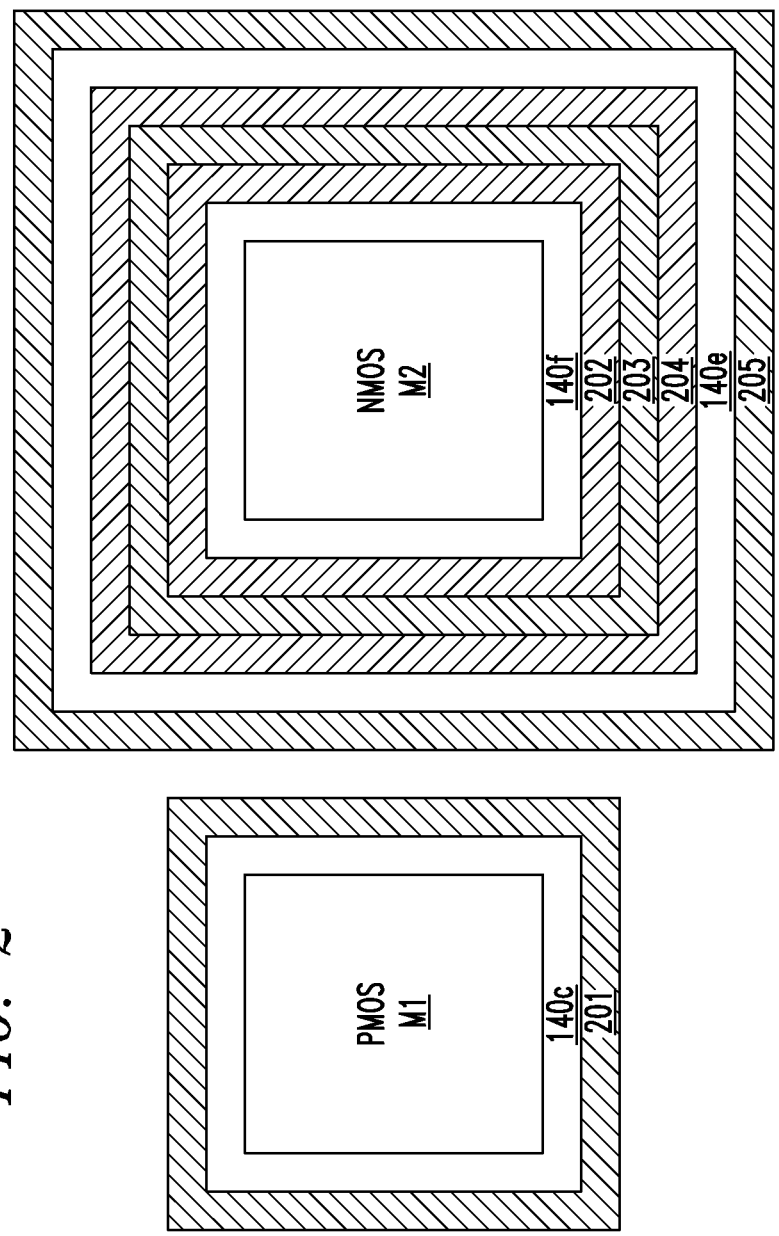
FIG. 2 is a plan view of an ESD protection circuit structure in accordance with some embodiments.
Figure 3:
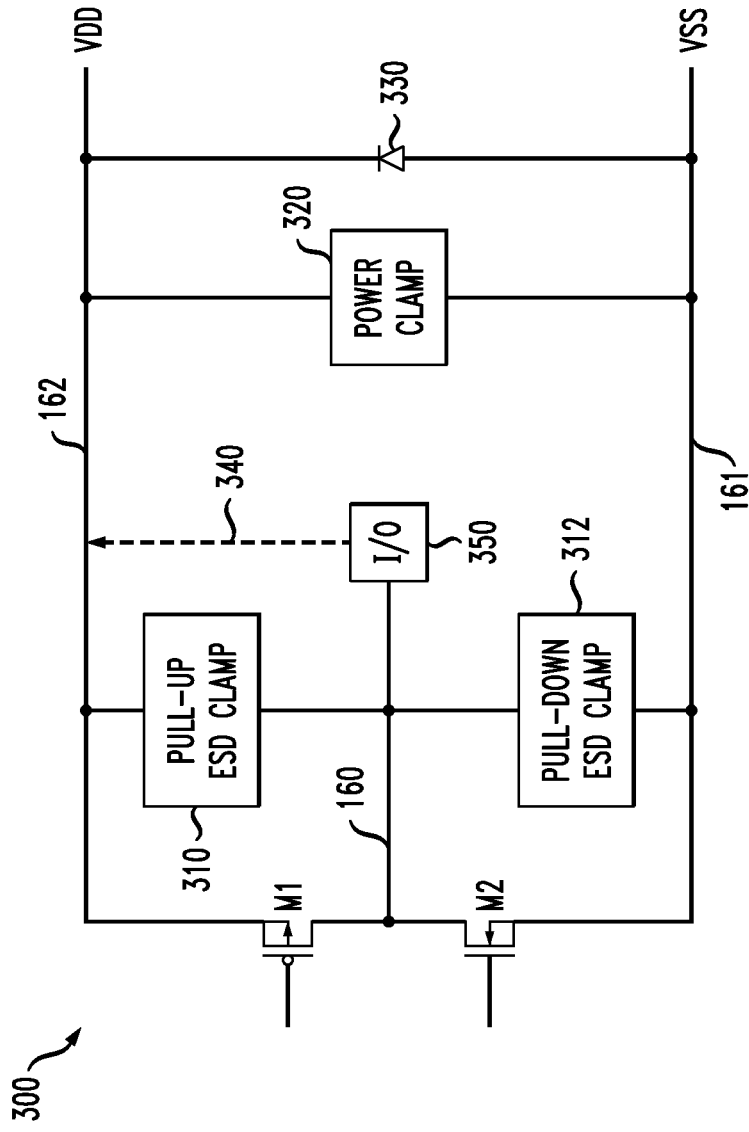
FIG. 3 is a schematic diagram of an ESD protection circuit in accordance with some embodiments.

FIG. 1 is a cross-sectional view of an electrostatic discharge (ESD) protection circuit structure in accordance with some embodiments of the present disclosure. N-type barrier layers 131 and 132 (denoted NBL in FIG. 1) are formed above a P-type semiconductor substrate 130. Above barrier layer 131, P-type diffusion region 101 and N-type diffusion region 102 are formed in P-well 121 and N-well 122, respectively, to provide drain and source terminals, respectively, of a PMOS transistor M1 (FIGS. 2 and 3). Above barrier layer 132, N-type diffusion region 108 and P-type diffusion region 109 are formed in N-well 126 and P-well 127, respectively, to provide drain and source terminals, respectively, of an NMOS transistor M2 (FIGS. 2 and 3).

P-type diffusion region 103 formed in P-well 123 serves as a guard ring 201 that surrounds the PMOS transistor M1 as shown in the plan view of FIG. 2. Other guard rings 202, 203, 204, and 205 are also shown in FIG. 2, with each guard ring depicted with diagonal hatching for visual clarity. Each guard ring is a P- or N-doped region that surrounds PMOS transistor M1 or NMOS transistor M2 and provides ESD protection as described further below. Guard ring 202 is provided by P-type diffusion region 107, which is formed in P-well 125. Guard ring 203 is provided by N-type diffusion region 206, which is formed in N-well 128. In some embodiments, P-well 125 is deeper than N-well 128. Guard ring 204 is provided by P-type diffusion region 105, which is formed in P-well 125. Guard ring 205 is provided by N-type diffusion region 104, which is formed in N-well 124.

In some embodiments, the P-type regions 101, 103, 105, 107, and 109 and/or N-type regions 102, 204, 106, 108 are heavily doped, with a doping concentration that is greater than a doping concentration of the respective doped wells in which they are formed, as indicated by P+ and N+ in FIG. 1. For convenience, these diffusion regions are henceforth referred to as P+ or N+ diffusion regions or diffusions are between about $10^{19}$ and $10^{21}$ cm$^{-3}$. In some embodiments, doping concentrations for the P+ and N+ diffusion regions are In some embodiments, the P+ diffusion regions are doped with a Group III material including, but not limited to, boron, gallium, aluminum, or the like, and the N+ diffusion regions are doped with a suitable N-type dopant such as arsenic, phosphorus, antimony, or another Group V element.

The P-wells and N-wells can be formed using any suitable semiconductor fabrication techniques. In some embodiments, these are doped regions, or the N-wells are doped and the P-wells are undoped P semiconductor substrate material. In some embodiments, the wells are deposited or grown in an epitaxial process, or silicon-on-insulator (SOI) techniques are used to form the N-wells and P-wells. In some embodiments, thermal diffusion and/or ion implantation are used to form the wells. In some embodiments, the N-wells and P-wells are high voltage wells.

In some embodiments, isolation regions 140a-140h (collectively "isolation regions 140") are shallow trench isolations (STI's), LOCOS (local oxidation of silicon) isolation regions, or other isolation regions that separate various diffusion regions from one another. In some embodiments, isolation regions 140 are formed from a dielectric material such as, for example, silicon dioxide.

Various pads 150a-150g (collectively "pads 150") provide electrical couplings as shown in FIG. 1. Input/output (I/O) pads 150a and 150f are electrically coupled to an I/O node 160, pads 150b and 150d are coupled to a positive power supply 162 node denoted VDD, and pads 150c, 150e, and 150g are coupled to a ground node 161 denoted VSS.

For the ESD stress mode referred to as an ND strike (negative voltage from I/O pad to VDD), a negative pulse is provided at the I/O pin (corresponding to node 160). Injected electrons flow into the I/O pin and along an N-P-N path that is provided by parasitic bipolar junction transistor (BJT) 172 (formed by P-well 125 and N-wells 124 and 126), from N+ diffusion region 108, to N-well 126, to P-well 125, to N-well 124, and to N+ diffusion region 104. Due to a relatively low breakdown voltage, transistor 172 is susceptible to burnout, causing ND mode failure that results in loss of ESD protection. Various embodiments of the present disclosure provide an electrical path with parasitic NPN transistor 170, which is formed by N-well 128, N-well 126, and P-well 125. NPN transistor 170 conducts some of the current that would otherwise flow along the path corresponding to NPN transistor 172. By diverting some of the current in this manner, breakdown voltage is increased, and ND mode failure is advantageously suppressed. Because N-well 128 is shallower than P-well 125, the current path from N-well 126 to N-well 124 is not blocked. Thus, guard rings 202, 203, 204, and 205 provide protection for the ND stress mode in this example.

In some embodiments, the width of P-well 125 is the same or nearly the same as the width of adjacent N-wells 124 and 126, and N-well 128 is formed in P-well 125. Thus, three guard rings 202, 203, 204 corresponding to diffusion regions 107, 106, and 105, respectively, are provided around transistor M2 without additional area requirements. In some embodiments, P-well 125 and N-wells 124, 126 are each about 7 μm wide. By providing a ground guard ring 203 (i.e., a ground ring that is coupled to VSS), various embodiments increase breakdown voltage (and thus suppress ND mode failure) without increasing device size (and thus cost) as in conventional approaches.

FIG. 3 is a schematic diagram of an ESD protection circuit in accordance with some embodiments. ESD protection circuit 300 includes transistors M1 and M2, I/O pad 350, nodes 161 and 162 having voltages VSS and VDD, respectively, pull-up ESD clamp 310 for pulling a voltage up to VDD, pull-down ESD clamp 312 for pulling a voltage down to VSS, power clamp 320, and diode 330 arranged as shown. In some embodiments, the pull-up and pull-down clamps are PN diodes, and the power clamp 320 is an NMOS device. In ND mode ESD testing, a negative pulse at I/O pad 350 can cause current to flow from I/O pad 350, through pull-down clamp 312 and power clamp 320, to node 162. Current can also flow through parasitic path 340 provided by NPN transistor 172, which has reduced susceptibility to burnout in various embodiments due to guard ring 203 that helps to conduct some current.

Figure 4:
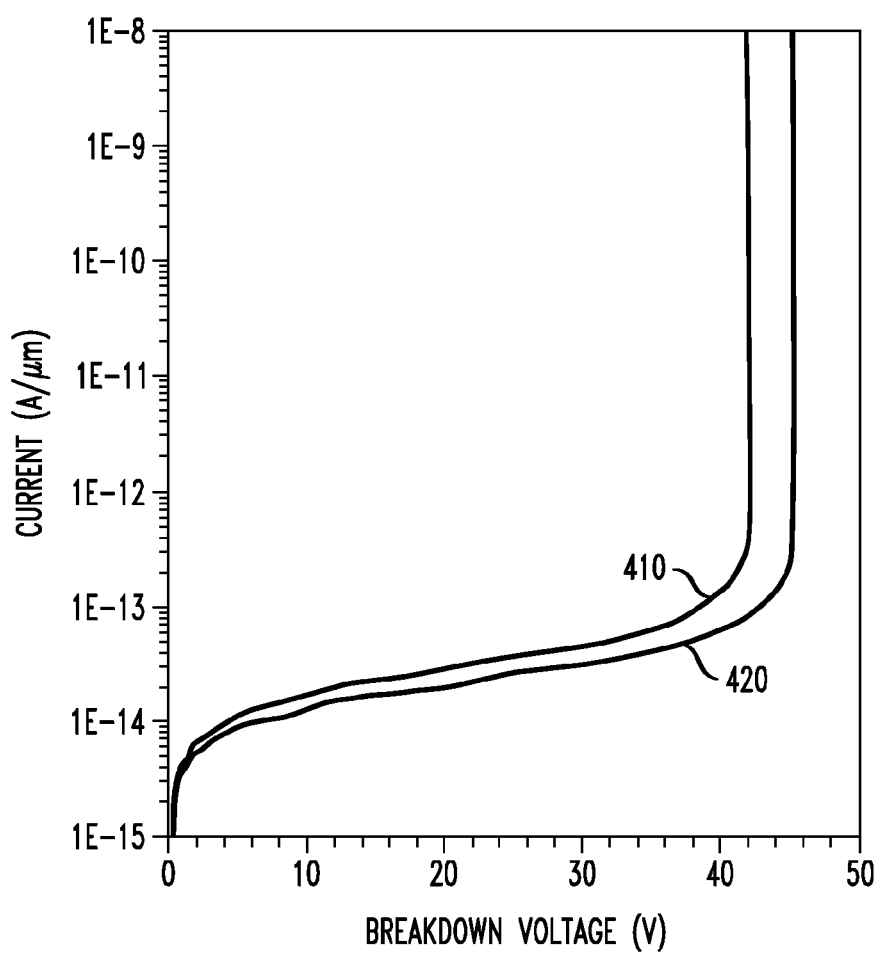
FIG. 4 is a plot of current vs. voltage in accordance with some embodiments.

Referring to FIG. 4, plot 410 is a plot of breakdown voltage (e.g., for ND mode testing) versus current for conventional techniques, and plot 420 is a plot of breakdown voltage (in units of volts) versus current (in units of amps per micrometer) in accordance with some embodiments. At any given level of current, breakdown voltage provided by various embodiments is increased relative to conventional techniques, improving ND mode performance. This increase in breakdown voltage is achieved without a size penalty (i.e., without increased size) for the device.

The example of FIG. 1 shows one N-well 128 formed in P-well 125, with an N+ diffusion region 106 formed in N-well 128. Thus, diffusion regions 105, 106, and 107 constitute a P-N-P structure. In other embodiments, additional N-wells (in addition to N-well 128) are formed in P-well 125, with an N+ diffusion region formed in each such N-well, to form a structure such as P-N-P-N-P, or P-N-P-N-P-N-P, etc.

In some embodiments, an electrostatic discharge (ESD) protection circuit includes a metal oxide semiconductor (MOS) transistor (e.g., transistor M1) of a first type (e.g., P-type), a MOS transistor (e.g., transistor M2) of a second type (e.g., N-type), an input/output (I/O) pad (e.g., pad 350), and first, second, and third guard rings of the first, second, and first types, respectively (e.g., guard rings 202, 203, 204). The MOS transistor of the first type has a source coupled to a first node (e.g., node 162) having a first voltage (e.g., VDD), and a drain coupled to a second node (e.g., node 160). The MOS transistor of the second type has a drain coupled to the second node, and a source coupled to a third node (e.g., node 161) having a second voltage (e.g., VSS) lower than the first voltage. The I/O pad is coupled to the second node. The first, second, and third guard rings are positioned around the MOS transistor of the second type.

In some embodiments, an ESD protection circuit structure includes a first diffusion region (e.g., region 105) of a first type (e.g., P-type), a second diffusion region (e.g., region 107) of the first type, a first diffusion region (e.g., region 106) of a second type (e.g., N-type), and a MOS transistor (e.g., M2) of the second type. The first diffusion region of the first type is formed in a first well (e.g., well 125) of the first type. The second diffusion region of the first type is formed in the first well of the first type. The first diffusion region of the second type is formed in a first well (e.g., well 128) of the second type, which is formed in the first well of the first type. The MOS transistor of the second type has a drain formed by a second diffusion region (e.g., region 108) of the second type formed in a second well (e.g., well 126) of the second type bordering the first well of the first type.

In some embodiments, an ESD protection circuit includes a MOS transistor (e.g., transistor M1) of a first type (e.g., P-type), a MOS transistor (e.g., transistor M2) of a second type (e.g., N-type), and first, second, and third guard rings (e.g., guard rings 202, 203, and 204, respectively). The MOS transistor of the first type has a source coupled to a first voltage source and a drain coupled to an input/output (I/O) pad (e.g., pad 350). The drain and the source of the MOS transistor of the first type are formed by a first diffusion region of the first type (e.g., region 101) and a first diffusion region of the second type (e.g., region 102), respectively. The first diffusion region of the first type and the first diffusion region of the second type are formed in a first well of the first type (e.g., well 121) and a first well of the second type (e.g., well 122), respectively. The MOS transistor of the second type has a drain coupled to the I/O pad and a source coupled to a second voltage source having a lower voltage (e.g., VSS) than a voltage (e.g., VDD) of the first voltage source. The source and the drain of the MOS transistor of the second type are formed by a second diffusion region of the first type (e.g., region 109) and a second diffusion region of the second type (e.g., region 108), respectively. The second diffusion region of the first type and the second diffusion region of the second type are formed in a second well of the first type (e.g., well 127) and a second well of the second type (e.g., well 126), respectively. The first guard ring includes a third diffusion region of the first type (e.g., region 107) formed in a third well of the first type (e.g., well 125) bordering the second well of the second type. The second guard ring includes a third diffusion region of the second type (e.g., region 106) formed in a third well of the second type (e.g., well 128). The third guard ring includes a fourth diffusion region of the first type (e.g., region 105) formed in the third well of the first type. The second guard ring is positioned between the first and third guard rings.

Although examples are illustrated and described herein, embodiments are nevertheless not limited to the details shown, since various modifications and structural changes may be made therein by those of ordinary skill within the scope and range of equivalents of the claims.

What is claimed is:

1. An electrostatic discharge (ESD) protection circuit comprising:
    a MOS transistor of a first type including a source coupled to a first node having a first voltage, and a drain coupled to a second node;
    a MOS transistor of a second type including a drain coupled to the second node, and a source coupled to a third node having a second voltage lower than the first voltage;
    an input/output (I/O) pad coupled to the second node;
    a first guard ring of the first type;
    a second guard ring of the second type; and
    a third guard ring of the first type;
    wherein the first, second, and third guard rings are positioned around the MOS transistor of the second type.

2. The electrostatic discharge (ESD) protection circuit of claim 1, wherein the first type is P-type and the second type is N-type.

3. The electrostatic discharge (ESD) protection circuit of claim 2, further comprising a fourth guard ring of the second type positioned around the MOS transistor of the second type.

4. The electrostatic discharge (ESD) protection circuit of claim 2, further comprising a fourth guard ring of the first type positioned around the MOS transistor of the first type.

5. The electrostatic discharge (ESD) protection circuit of claim 2, wherein:
    the first guard ring is closest, among the first, second, and third guard rings, to the MOS transistor of the second type;
    the second guard ring is positioned around the first guard ring; and
    the third guard ring is positioned around the second guard ring.

6. The electrostatic discharge (ESD) protection circuit of claim 2, wherein a diffusion region of the second type of the MOS transistor of the second type, the first guard ring, and the second guard ring form a parasitic bipolar NPN transistor.

7. The electrostatic discharge (ESD) protection circuit of claim 2, wherein the first and third guard rings each include a corresponding diffusion region of the first type formed in a well of the first type, the second guard ring includes a diffusion region of the second type formed in a well of the second type, and the well of the first type is deeper than the well of the second type.

8. The ESD protection circuit of claim 2, wherein the second guard ring includes a diffusion region of the second type coupled to the third node.

9. An electrostatic discharge (ESD) protection circuit comprising:
    a MOS transistor of a first type including a source coupled to a first voltage source and a drain coupled to an input/output (I/O) pad, wherein the drain and the source of the MOS transistor of the first type are formed by a first diffusion region of the first type and a first diffusion region of a second type, respectively, and the first diffusion region of the first type and the first diffusion region of the second type are formed in a first well of the first type and a first well of the second type, respectively;
    a MOS transistor of the second type including a drain coupled to the I/O pad and a source coupled to a second voltage source having a lower voltage than a voltage of the first voltage source, wherein the source and the drain of the MOS transistor of the second type are formed by a second diffusion region of the first type and a second diffusion region of the second type, respectively, and the second diffusion region of the first type and the second diffusion region of the second type are formed in a second well of the first type and a second well of the second type, respectively;
    a first guard ring including a third diffusion region of the first type formed in a third well of the first type bordering the second well of the second type;
    a second guard ring including a third diffusion region of the second type formed in a third well of the second type; and
    a third guard ring including a fourth diffusion region of the first type formed in the third well of the first type;
    wherein the second guard ring is positioned between the first and third guard rings.

10. The ESD protection circuit structure of claim 9, wherein the first type is P-type and the second type is N-type.

11. The ESD protection circuit structure of claim 10, further comprising a fourth guard ring including a fourth diffusion region of the second type formed in a fourth well of the second type bordering the third well of the first type.

\* \* \* \* \*